(12) United States Patent
Ru et al.

(10) Patent No.: US 10,523,220 B1
(45) Date of Patent: Dec. 31, 2019

(54) QUADRATURE DELAY LOCKED LOOPS

(71) Applicant: Avago Technologies International Sales Pte. Limited, Singapore (SG)

(72) Inventors: Zhiyu Ru, Irvine, CA (US); Tim Yee He, Irvine, CA (US); Siavash Fallahi, Irvine, CA (US); Ali Nazemi, Irvine, CA (US); Delong Cui, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/356,747

(22) Filed: Mar. 18, 2019

(51) Int. Cl.
| | |
|---|---|
| *H03L 7/095* | (2006.01) |
| *G11C 7/22* | (2006.01) |
| *H03L 7/08* | (2006.01) |
| *H03L 7/081* | (2006.01) |

(52) U.S. Cl.
CPC .............. *H03L 7/095* (2013.01); *G11C 7/222* (2013.01); *H03L 7/0805* (2013.01); *H03L 7/0814* (2013.01)

(58) Field of Classification Search
None
See application file for complete search history.

(56) References Cited

U.S. PATENT DOCUMENTS

| | | | |
|---|---|---|---|
| 6,642,760 B1 * | 11/2003 | Alon ...................... | H03K 3/037 327/158 |
| 10,326,432 B2 * | 6/2019 | Lee ...................... | H03B 5/1228 |

OTHER PUBLICATIONS

Kaul et al., An UWB, Low-Noise, Low-Power Quadrature VCO using Delay-Locked Loop in 40-nm CMOS for Image-Rejection Receivers, 2018 IEEE International Symposium on Circuits and Systems (ISCAS), conference dated May 27-30, 2018, 5 pages.

\* cited by examiner

*Primary Examiner* — Jeffery S Zweizig
(74) *Attorney, Agent, or Firm* — Foley & Lardner LLP

(57) ABSTRACT

Disclosed herein are embodiments of an apparatus and a method for generating a quadrature clock signal. In one aspect, the apparatus includes a first delay circuitry to delay a clock signal according to a first control signal to generate a first delayed clock signal. In one aspect, the apparatus includes a second delay circuitry to delay the clock signal according to a second control signal to generate a second delayed clock signal. In one aspect, the apparatus includes a delay controller forming a first feedback loop with the first delay circuitry, and forming a second feedback loop with the second delay circuitry, where the delay controller determines a difference between the first delayed clock signal and the second delayed clock signal and modifies the first control signal and the second control signal according to the determined difference.

20 Claims, 9 Drawing Sheets

200

300

QUADRATURE DELAY LOCKED LOOPS

FIELD OF THE DISCLOSURE

This disclosure generally relates to systems and methods for a clock signal generation, including but not limited to systems and methods for generating high speed (e.g., 10 GHz or higher) quadrature clock signals.

BACKGROUND OF THE DISCLOSURE

Many electronic systems operate according to quadrature clock signals having 90-degree phase differences to improve efficiency. In one example, a digital system samples data and processes the sampled data according to a frequency of a clock signal. Operating a digital system according to quadrature clock signals enables improvement in a data rate, a signal to noise ratio, or an eye diagram. In another example, a communication system upconverts or downconverts an electrical signal onto quadrature clock signals (also referred to as "quadrature carrier signals"). Employing quadrature clock signals allows communication through a single side band rather than a double side band, thus allowing conservation of bandwidth.

Operating performance of an electronic system employing quadrature clock signals depends on an accuracy of phases of the quadrature clock signals. For example, phase errors of quadrature clock signals reduce a signal to noise ratio or an eye diagram of a digital system. For another example, phase errors of quadrature clock signals of a communication system reduce suppression of spectral components at an unintended sideband. However, generating high speed (e.g., over 10 GHz) clock signals with accurate phases is challenging.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
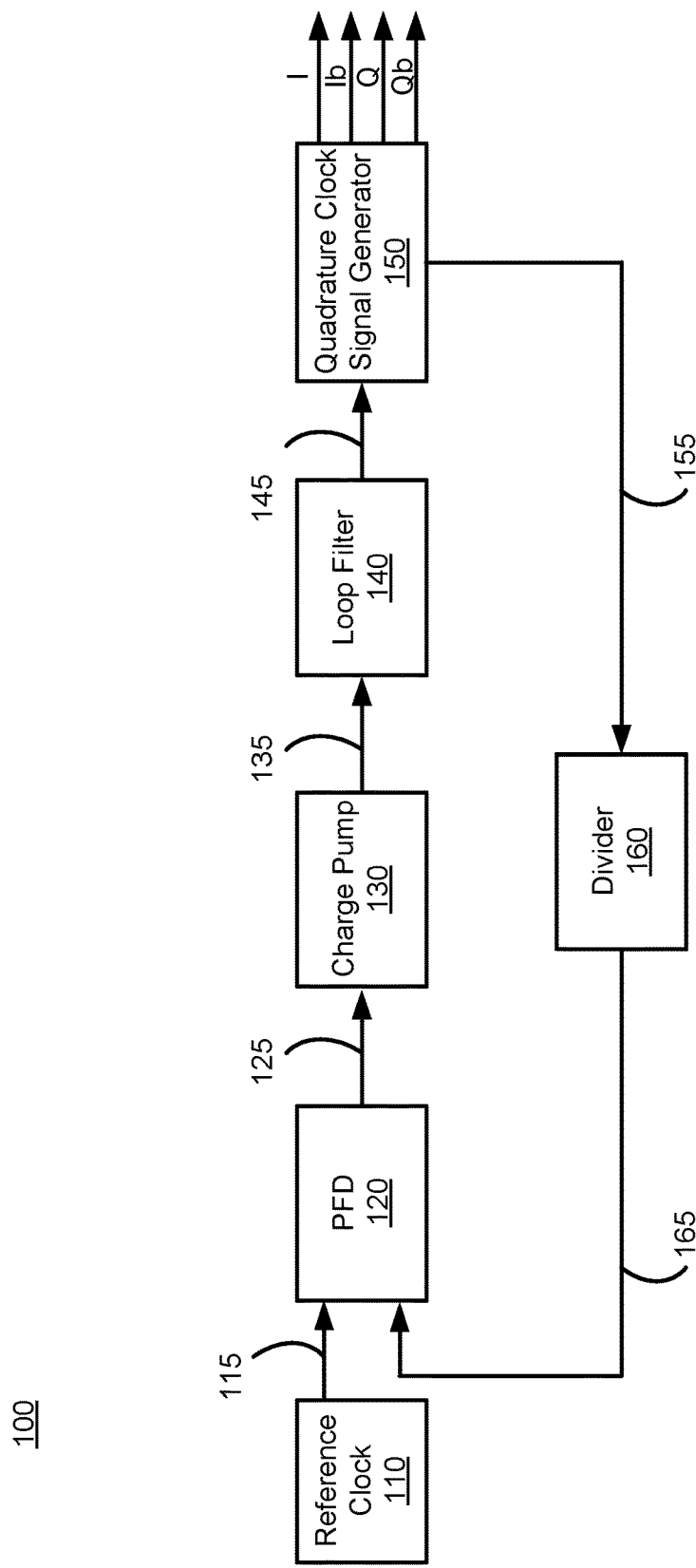
FIG. 1 is a diagram depicting an example phase locked loop.

The details of various embodiments of the methods and systems are set forth in the accompanying drawings and the description below.

DETAILED DESCRIPTION

For purposes of reading the description of the various embodiments below, the following descriptions of the sections of the specification and their respective contents may be helpful:

Section A describes embodiments of a high speed quadrature clock signal generator; and Section B describes a network environment and computing environment which may be useful for practicing embodiments described herein.

A. High Speed Quadrature Clock Signal Generator

Disclosed herein are various aspects of systems (or apparatuses) and methods for a high speed (e.g., over 10 GHz) quadrature clock signal generation.

In some embodiments, a disclosed system includes an oscillator circuitry that generates a clock signal. In some embodiments, the system includes a first delay circuitry coupled to the oscillator circuitry, where the first delay circuitry delays the clock signal from the oscillator circuitry according to a first control signal to generate a first delayed clock signal. In some embodiments, the system includes a second delay circuitry coupled to the oscillator circuitry, where the second delay circuitry delays the clock signal from the oscillator circuitry according to a second control signal to generate a second delayed clock signal. In one aspect, the first delayed clock signal and the second delayed clock signal have a substantially 90-degree phase difference (e.g., within ±1 degree error) and constitute quadrature clock signals. In some embodiments, the system includes a delay controller circuitry coupled to the first delay circuitry and the second delay circuitry. In some embodiments, the delay controller circuitry and the first delay circuitry form a first feedback loop and the delay controller circuitry and the second delay circuitry form a second feedback loop. In some embodiments, the delay controller circuitry modifies i) the first control signal based on the first delayed clock signal through the first feedback loop and ii) the second control signal based on the second delayed clock signal through the second feedback loop.

Advantageously, the disclosed system employing two delay circuitries allows quadrature clock signals with accurate phases to be generated in a robust manner. In one example, quadrature clock signals are generated by delaying a clock signal with a single delay circuitry to obtain two clock signals having a 90-degree phase difference. However, components (e.g., transistors) of an electronic system are susceptible to process, voltage, temperature (PVT) variations. In some examples, controlling or adjusting a delay by the single delay circuitry to obtain two signals having a 90-degree phase difference to compensate for PVT variations is difficult or unfeasible because of a characteristic of a transistor (e.g., a speed of a transistor or a transition frequency Ft of the transistor). By employing two delay circuitries, controlling or adjusting delays by two delay circuitries to obtain two signals having a 90-degree phase difference with each other depends on a relative timing difference of the two signals, and is less susceptible to a characteristic of a transistor. Accordingly, tuning range or an operating delay range is improved by employing two delay circuitries compared to a single delay circuitry.

Referring to FIG. 1, illustrated is a diagram depicting an example phase locked loop (PLL) 100, according to some embodiments. In some embodiments, the phase locked loop 100 includes a reference clock 110 (also referred to as "a reference clock circuitry 110" herein), a phase frequency detector (PFD) 120, a charge pump 130 (also referred to as "a charge pump circuitry 130" herein), a loop filter 140 (also referred to as "a loop filter circuitry 140" herein), a quadrature clock signal generator 150 (also referred to as "a quadrature clock signal generator circuitry 150" herein), and a divider 160 (also referred to as "a divider circuitry 160" herein). In some embodiments, these components are implemented on a same integrated circuit or different integrated circuits. These components operate together to receive a reference signal 115 from the reference clock 110 and multiply the frequency of the reference signal 115 to obtain high speed (e.g., over 10 GHz) quadrature clock signals I, Ib, Q, Qb having 90-degree phase differences. In some embodiments, the quadrature clock signals are provided to components (e.g., modulators) of a high speed communication system or to components (e.g., analog to digital converter) of a high speed digital system. In some embodiments, the PLL 100 includes more, fewer, or different components than shown in FIG. 1. For example, the reference clock 110 is implemented as a separate component or an external component of the PLL 100.

The reference clock 110 is a component or a circuitry that generates the reference signal 115. In some embodiments, the reference clock 110 is implemented as a crystal oscillator or a micro-electro-mechanical systems (MEMS) component. In one aspect, the reference clock 110 generates the reference signal 115 with a low phase error (e.g., less than 150 ppm) at a low frequency (e.g., 10~100 MHz).

The PFD 120 is a component or a circuitry that receives the reference signal 115 from the reference clock 110 and a feedback signal 165 from a divider 160, and generates an error signal 125 according to the reference signal 115 and the feedback signal 165, in one or more embodiments. In some embodiments, the PFD 120 compares states of the reference signal 115 and the feedback signal 165, and generates a pulse indicating a difference in states of the reference signal 115 and the feedback signal 165 as the error signal 125. In one aspect, the pulse of the error signal 125 indicates a difference in a phase, a frequency, or a combination of the phase and frequency of the reference signal 115 and the feedback signal 165.

The charge pump 130 is a component or a circuitry that receives the error signal 125 from the PFD 120, and generates a control signal 135 according to the error signal 125, in one or more embodiments. In some embodiments, the charge pump 130 charges or discharges a node coupled to the loop filter 140 according to the pulse of the error signal 125 to generate the control signal 135. For example, the charge pump 130 charges the node (or increases a voltage at the node) in response to the error signal indicating that the frequency of the feedback signal 165 is lower than the frequency of the reference signal 115, or in response to the error signal indicating that the feedback signal 165 is lagging the reference signal 115. For example, the charge pump 130 discharges the node (or decreases a voltage at the node) in response to the error signal indicating that the frequency of the feedback signal 165 is higher than the frequency of the reference signal 115, or in response to the error signal indicating that the feedback signal 165 is leading the reference signal 115.

The loop filter 140 is a component or a circuitry that receives the control signal 135 and filters out spectral components of the control signal 135 over a predetermined frequency to obtain a filtered control signal 145. In some embodiments, the loop filter 140 is implemented as a second order or a higher order low pass filter to achieve a loop stability of the PLL 100.

The quadrature clock signal generator 150 is a component or a circuitry that receives the filtered control signal 145 and generates quadrature clock signals I, Ib, Q, Qb according to the filtered control signal 145, in one or more embodiments. In one aspect, quadrature clock signals I and Q have a 90-degree phase difference with each other, quadrature clock signals Q and Ib have a 90-degree phase difference with each other, quadrature clock signals Ib and Qb have a 90-degree phase difference with each other, and quadrature clock signals Qb and I have a 90-degree phase difference with each other. In some embodiments, the quadrature clock signal generator 150 generates the quadrature clock signals I, Ib, Q, Qb at a high speed (e.g., over 10 GHz), according to the filtered control signal 145. In one example, the quadrature clock signal generator 150 increases the frequency of the quadrature clock signals I, Ib, Q, Qb in response to an increased voltage of the filtered control signal 145, and decreases the frequency of the quadrature clock signals I, Ib, Q, Qb in response to a decreased voltage of the filtered control signal 145. Detailed implementations and operations of the quadrature clock signal generator 150 are provided below with respect to FIGS. 2 through 7.

The divider 160 is a component or a circuitry that receives a high speed clock signal 155 from the quadrature clock signal generator 150, and generates the feedback signal 165 indicating a frequency and phase of the high speed clock signal 155. In one aspect, the high speed clock signal 155 is one of the quadrature clock signals I, Ib, Q, Qb, or a signal having the same frequency of the quadrature clock signals. In some embodiments, the divider 160 divides a frequency of the high speed clock signal 155 by a division factor (e.g., an integer, a fraction, or a combination of integer and fraction), such that the frequency of the quadrature clock signals I, Ib, Q, Qb is equal to a multiplication of the frequency of the reference signal 115 and the division factor.

Figure 2:
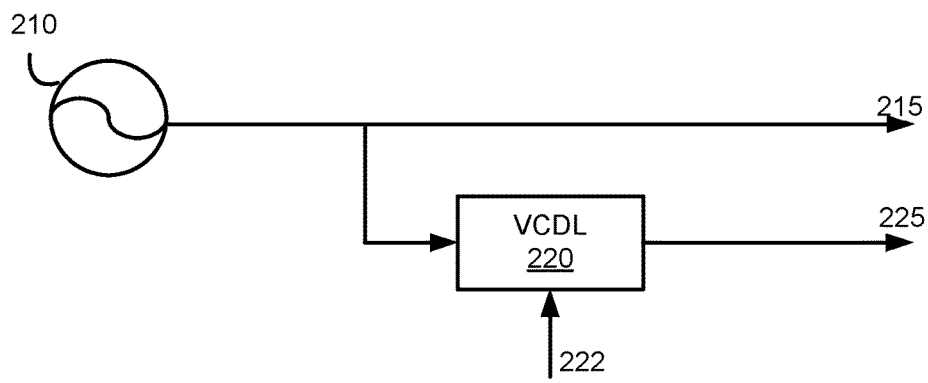
FIG. 2 is a diagram depicting a simplified schematic model of an example quadrature clock signal generator.

Referring FIG. 2, illustrated is a diagram depicting a simplified schematic model of an example quadrature clock signal generator 200, according to one implementation. In one implementation, the quadrature clock signal generator 200 is implemented as a portion of the quadrature clock signal generator 150 of FIG. 1. In one implementation, the quadrature clock signal generator 200 includes a voltage controlled oscillator (VCO) 210 and an adjustable delay circuitry 220. These components operate together to generate quadrature clock signals 215, 225 having a 90-degree phase difference with each other. In one example, the quadrature clock signals 215, 225 correspond to the quadrature clock signals I, Q of FIG. 1.

The VCO 210 (also referred to as "a VCO circuitry 210" herein) is a component or a circuitry that generates a high speed (e.g., over 10 GHz) clock signal 215 in response to a control signal (e.g., the filtered control signal 145 of FIG. 1). In one implementation, the VCO 210 generates the clock signal at a frequency corresponding to a voltage of the control signal. In one example, the VCO 210 increases the frequency of the high speed clock signal 215 in response to an increased voltage of the filtered control signal 145, and decreases the frequency of the high speed clock signal 215 in response to a decreased voltage of the filtered control signal 145.

The adjustable delay circuitry 220 (also referred to as "a voltage controlled delay line (VCDL) 220") is a component or a circuitry that delays the high speed clock signal 215 from the VCO 210 according to a delay control signal 222 to generate a delayed clock signal 225. In one implementation, the adjustable delay circuitry 220 includes inverters and/or amplifiers connected in cascade, where a delay of each inverter or amplifier is adjustable according to the delay control signal 222. For example, the adjustable delay circuitry 220 increases an amount of delay applied to the high speed clock signal 215 in response to an increased voltage of the delay control signal 222. In one aspect, the adjustable delay circuitry 220 delays the high speed clock signal 215 by a time duration corresponding to a 90-degree phase shift, such that the high speed clock signals 215, 225 have a substantially 90-degree phase difference with each other and are output as quadrature clock signals.

Although in FIG. 2, the quadrature clock signal generator 200 is shown to generate two quadrature clock signals 215, 225 having a 90-degree phase difference, the other signals of the quadrature clock signals I, Ib, Q, Qb are obtained by generating signals having inverted phases of the quadrature clock signals 215, 225, in one implementation.

Despite the simplicity of the structure of the quadrature clock signal generator 200 having a single adjustable delay circuitry 220, the quadrature clock signal generator 200 suffers from a few drawbacks. For example, the performance of components (e.g., transistors) of the delay circuitry is susceptible to process, voltage, temperature (PVT) variations. Moreover, a frequency of the VCO 210 is subject to change. To accommodate the change in the frequency of the VCO 210 and/or PVT variations, the adjustable delay circuitry 220 changes the delay amount (e.g., by a quarter of a period of the clock signals 215, 225) such that the quadrature clock signals 215, 225 have a 90-degree phase difference. However, controlling or adjusting a delay of the adjustable delay circuitry 220 depends on characteristics of the components (e.g., a speed of a transistor or a transition frequency Ft of the transistor). For example, in some cases, the adjustable delay circuitry 220 should delay the quadrature clock signal 215 by 25 ps for a clock signal having a 100 ps clock period (or 10 GHz), but the minimum delay or the resolution of the delay controlled by the adjustable delay circuitry 220 is larger than 25 ps because of PVT variations, thus the phase difference between the clock signals 215, 225 becomes larger than 90-degrees.

Figure 3:
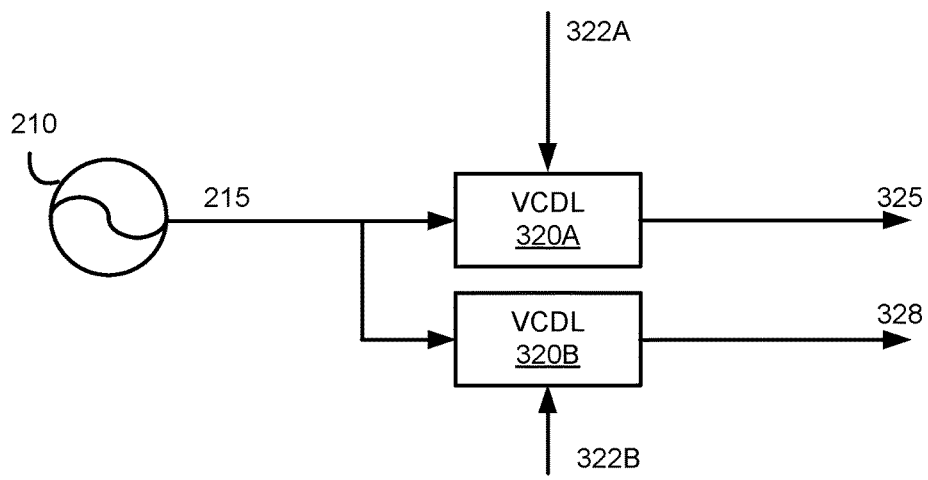
FIG. 3 is a diagram depicting a simplified schematic model of another example quadrature clock signal generator.

Referring to FIG. 3, illustrated is a diagram depicting a simplified schematic model of another example quadrature clock signal generator 300 (also referred to as "a quadrature delay locked loop 300" herein), according to some embodiments. In some embodiments, the quadrature clock signal generator 300 is implemented as a portion of the quadrature clock signal generator 150 of FIG. 1. In some embodiments, the quadrature clock signal generator 300 includes the VCO 210 and adjustable delay circuitries 320A, 320B. These components operate together to generate quadrature clock signals 325, 328 having a 90-degree phase difference with each other. In one example, the quadrature clock signals 325, 328 correspond to the quadrature clock signals I, Q of FIG. 1.

In one aspect, the quadrature clock signal generator 300 is similar to the quadrature clock signal generator 200 of FIG. 2, except the quadrature clock signal generator 300 includes two adjustable delay circuitries 320A, 320B instead of the single adjustable delay circuitry 220. Each delay circuitry 320 is implemented or operates in a similar manner as the adjustable delay circuitry 220 of FIG. 2. Thus, detailed description of the duplicated portion is omitted herein for the sake of brevity.

In some embodiments, the adjustable delay circuitry 320A receives the high speed clock signal 215 and a delay control signal 322A, and generates a delayed clock signal 325 by delaying the high speed clock signal 215 according to the delay control signal 322A. Similarly, the adjustable delay circuitry 320B receives the high speed clock signal 215 and a delay control signal 322B, and generates a delayed clock signal 328 by delaying the high speed clock signal 215 according to the delay control signal 322B. In one example, the high speed clock signal 215 has a frequency over 10 GHz, where the adjustable delay circuitries 320A, 320B delay the high speed clock signal 215 by 10~50 ps. Unlike the quadrature clock signal generator 200 of FIG. 2, a phase difference of the delayed clock signals 325, 328 is obtained by independently controlling the adjustable delay circuitries 320A, 320B. Accordingly, tuning range or an operating delay range of the quadrature clock signal generator 300 is improved compared to the quadrature clock signal generator 200 of FIG. 2.

Figure 4:
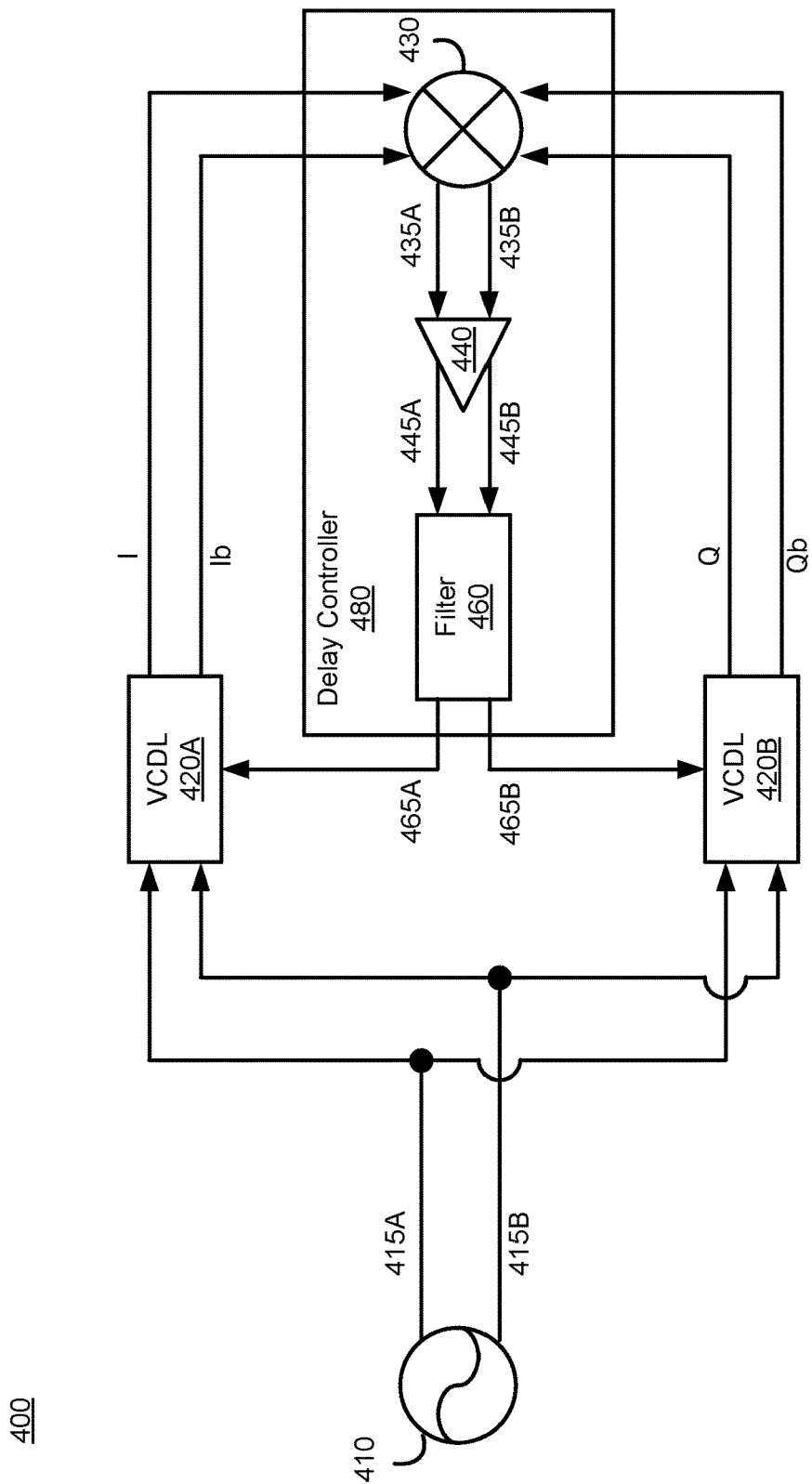
FIG. 4 is a diagram depicting an example quadrature clock signal generator.

Referring to FIG. 4, illustrated is a diagram depicting an example quadrature clock signal generator 400 (also referred to as "a quadrature delay locked loop 400" herein), according to some embodiments. In some embodiments, the quadrature clock signal generator 400 is implemented as the quadrature clock signal generator 300 of FIG. 3. In some embodiments, the quadrature clock signal generator 400 includes a VCO 410 (also referred to as "a VCO circuitry 410" herein), adjustable delay circuitries 420A, 420B (also referred to as "voltage controlled delay line (VCDL) 420" herein), and a delay controller 480 (also referred to as "a delay controller 480"). In some embodiments, the quadrature clock signal generator 400 includes more, fewer, or different components than shown in FIG. 4.

In some embodiments, the VCO 410 is similar to the VCO 210 of FIG. 2, except the VCO 410 generates high speed (e.g., over 10 GHz) clock signals 415A, 415B. In one configuration, the VCO 410 includes a first output port, at which the high speed clock signal 415A is output, and a second output port, at which the high speed clock signal 415B is output. In one aspect, the high speed clock signal 415B is an inverted clock signal having a substantially 180-degree phase difference (e.g., within ±1 degree error) with the high speed clock signal 415A. In some embodiments, the VCO 410 generates the high speed clock signals 415A, 415B, in response to the filtered control signal 145 from the loop filter 140 of FIG. 1.

The adjustable delay circuitry 420A is a circuitry or a component that delays the high speed clock signals 415A, 415B according to a first delay control signal 465A from the delay controller 480 to generate quadrature clock signals I, Ib. In one configuration, the adjustable delay circuitry 420A includes a first input port coupled to the first output port of the VCO 410, a second input port coupled to the second output port of the VCO 410, and a control port coupled to a first output port of the delay controller 480. In some embodiments, the adjustable delay circuitry 420A additionally includes a first output port and a second output port. In this configuration, the adjustable delay circuitry 420A receives the high speed clock signal 415A at the first input port, the high speed clock signal 415B at the second input port, and a first delay control signal 465A at the control port. In some embodiments, the adjustable delay circuitry 420A delays the high speed clock signal 415A according to the first delay control signal 465A to obtain the quadrature clock signal I, and delays the high speed clock signal 415B according to the first delay control signal 465A to obtain the quadrature clock signal Ib having a 180-degree phase difference with the quadrature clock signal I. In some embodiments, the adjustable delay circuitry 420A outputs the quadrature clock signal I at the first output port, and outputs the quadrature clock signal Ib at the second output port.

The adjustable delay circuitry 420B is a circuitry or a component that delays the high speed clock signals 415A, 415B according to a delay control signal 465B from the delay controller 480 to generate quadrature clock signals Q, Qb. In one configuration, the adjustable delay circuitry 420B includes a first input port coupled to the first output port of the VCO 410, a second input port coupled to the second output port of the VCO 410, and a control port coupled to a second output port of the delay controller 480. In some embodiments, the adjustable delay circuitry 420B additionally includes a first output port and a second output port. In this configuration, the adjustable delay circuitry 420B receives the high speed clock signal 415A at the first input port, the high speed clock signal 415B at the second input port, and a second delay control signal 465B at the control port. In some embodiments, the adjustable delay circuitry 420B delays the high speed clock signal 415A according to the second delay control signal 465B to obtain the quadrature clock signal Q having a 90-degree phase difference with the quadrature clock signal I, and delays the high speed clock signal 415B according to the second delay control signal 465B to obtain the quadrature clock signal Qb having a 180-degree phase difference with the quadrature clock signal Q. In some embodiments, the adjustable delay circuitry 420B outputs the quadrature clock signal Q at the first output port, and outputs the quadrature clock signal Qb at the second output port.

In some embodiments, the adjustable delay circuitries 420A, 420B are implemented as different circuitries with different tuning ranges or different operating delay ranges to delay the high speed clock signals 415A, 415B by different amounts. In one example, a clock period of a 10 GHz signal is 100 ps and the adjustable delay circuitry 420A delays the high speed clock signal 415A by 30 ps to generate the quadrature clock signal I, where the adjustable delay circuitry 420B delays the high speed clock signal 415A by 55 ps to generate the quadrature clock signal Q, where. In one example, the tuning range of the first adjustable delay circuitry 420A is between 10 ps to 50 ps, where the tuning range of the second adjustable delay circuitry 420B is between 35 ps and 75 ps. By controlling delays applied to the high speed clock signals 415A, 415B by the adjustable delay circuitry 420A and delays applied to the high speed clock signals 415A, 415B by the adjustable delay circuitry 420B collaboratively, accurate quadrature clock signals I, Ib, Q, Qb are obtained.

The delay controller 480 is a component or a circuitry that receives the quadrature clock signals I, Ib, Q, Qb, and generates the delay control signals 465A, 465B based on the quadrature clock signals I, Ib, Q, Qb. In one aspect, the delay controller 480 and the adjustable delay circuitry 420A form a first feedback loop, and the delay controller 480 and the adjustable delay circuitry 420B form a second feedback loop. Through the feedback loops, the delay controller 480 adjusts or modifies the quadrature clock signals I, Ib, Q, Qb, such that the quadrature clock signals I, Ib, Q, Qb have accurate phases relative to one another for instance (or the quadrature clock signals I, Ib, Q, Qb have 90-degree phase differences).

In some embodiments, the delay controller 480 includes a downconverter 430 (also referred to as "a downconverter 430"), an amplifier 440 (also referred to as "an amplifier circuitry 440"), and a filter 460 (also referred to as "a filter circuitry 460"). These components operate together to receive the quadrature clock signals I, Ib, Q, Qb, and generate delay control signals 465A, 465B. In other embodiments, the delay controller 480 includes more, fewer, or different components than shown in FIG. 4.

The downconverter 430 is a component or a circuitry that downconverts the quadrature clock signals I, Ib, Q, Qb to generate downconverted signals 435A, 435B. In one implementation, the downconverter 430 is implemented as an active circuitry or a passive circuitry. In one configuration, the downconverter 430 includes a first input port coupled to the first output port of the adjustable delay circuitry 420A, a second input port coupled to the second output port of the adjustable delay circuitry 420A, a third input port coupled to the first output port of the adjustable delay circuitry 420B, and a fourth input port coupled to the second output port of the adjustable delay circuitry 420B. In some embodiments, the downconverter 430 additionally includes a first output port and a second output port. In this configuration, the downconverter 430 receives the quadrature clock signal I at the first input port, the quadrature clock signal Ib at the second input port, the quadrature clock signal Q at the third input port, and the quadrature clock signal Qb at the fourth input port. In some embodiments, the downconverter 430 downconverts the quadrature clock signals I, Ib, Q, Qb to obtain the downconverted signals 435A, 435B at a near DC frequency (e.g., between 0 Hz and 5 kHz). In one aspect, the downconverter 430 mixes the quadrature clock signals I, Ib with the quadrature clock signals Q, Qb to obtain their phase differences at a near DC frequency. In some embodiments, the downconverter 430 outputs the downconverted signal 435A at the first output port and the downconverted signal 435B at the second output port.

The amplifier 440 is a component or a circuitry that amplifies the downconverted signals 435A, 435B to obtain amplified signals 445A, 445B, in one or more embodiments. In some embodiments, the amplifier 440 includes a first input port coupled to the first output port of the downconverter 430, and a second input port coupled to the second output port of the downconverter 430. In some embodiments, the amplifier 440 additionally includes a first output port and a second output port. In some embodiments, the amplifier 440 amplifies the downconverted signals 435A, 435B by a predetermined amount or by an adjustable amount, and outputs the amplified signal 445A at the first output port and the amplified signal 445B at the second output port. In some embodiments, the amplifier 440 is omitted, or is integrated as part of the downconverter 430, the filter 460 or both.

The filter 460 is a component or a circuitry that receives the amplified signals 445A, 445B and filters spectral components over a predetermined frequency in the amplified signals 445A, 445B to generate the delay control signals 465A, 465B. In some embodiments, the filter 460 includes a first input port coupled to the first output port of the amplifier 440, a second input port coupled to the second output port of the amplifier 440, a first output port coupled to the control port of the adjustable delay circuitry 420A, and a second output port coupled to the control port of the adjustable delay circuitry 420B. In this configuration, the filter 460 filters spectral components or unwanted harmonics over a predetermined frequency in the amplified signal 445A to generate the first delay control signal 465A, and filters spectral components or unwanted harmonics over a predetermined frequency in the amplified signal 445B to generate the second delay control signal 465B. In some embodiments, the filter 460 is implemented as a low pass filter or a bandpass filter. In some embodiments, the filter 460 outputs the first delay control signal 465A at the first output port and the second delay control signal 465B at the second output port. In one approach, the first delay control signal 465A causes the adjustable delay circuitry 420A to decrease delay applied to the high speed clock signals 415A, 415B, while the second delay control signal 465B causes the adjustable delay circuitry 420B to increase delay applied to the high speed clock signals 415A, 415B. In one approach, the second delay control signal 465B causes the adjustable delay circuitry 420B to apply more delay than a delay applied by the adjustable delay circuitry 420A according to the first delay control signal 465A. In some embodiments, each of the delay control signals 465A, 465B is implemented as differential signals (e.g., delay control signal 465A comprises two signals and delay control signal 465B comprises two signals). In other embodiments, each of the delay control signals 465A, 465B is implemented as a single ended signal (e.g., a single signal).

Figure 5:
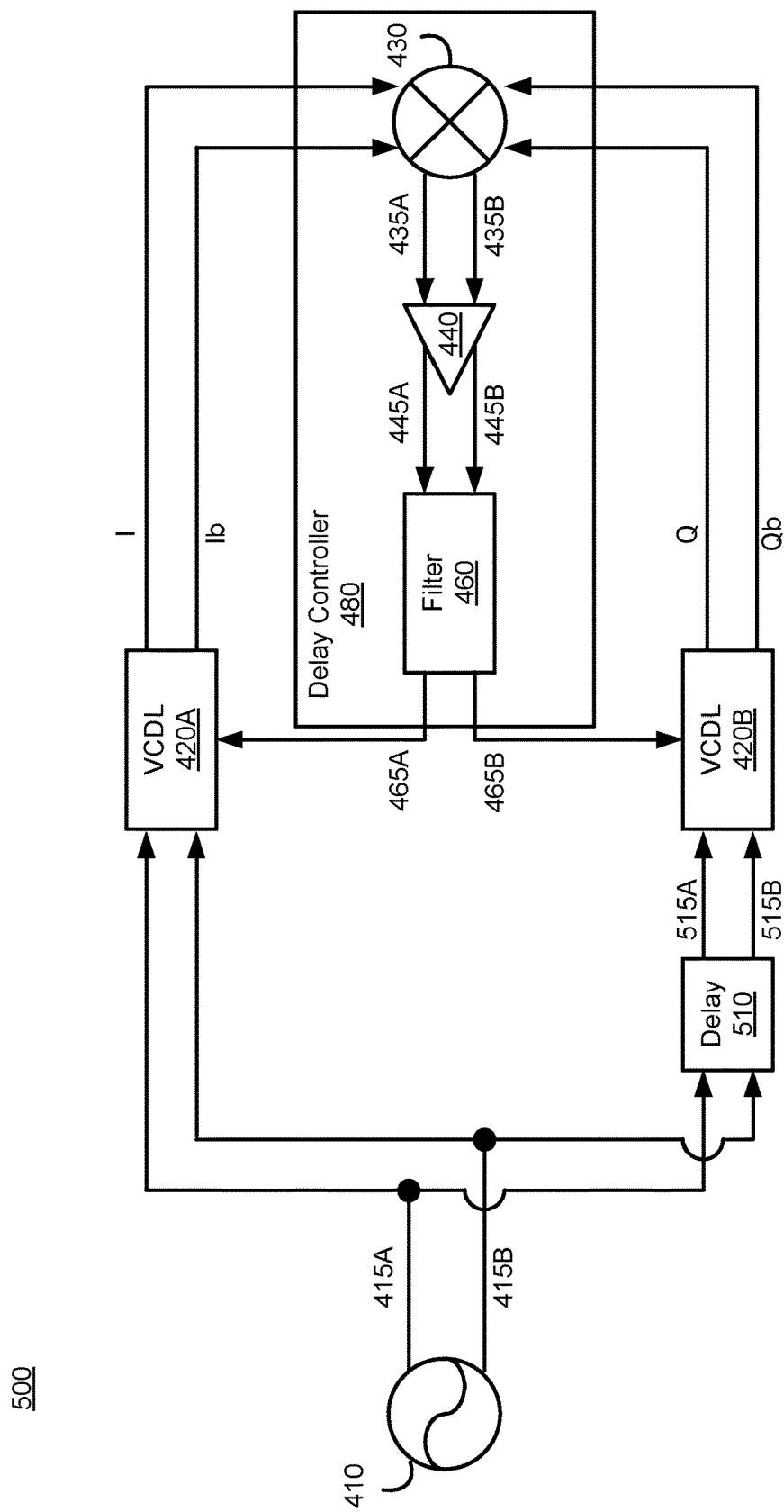
FIG. 5 is a diagram depicting another example quadrature clock signal generator.

Referring to FIG. 5, illustrated is a diagram depicting an example quadrature clock signal generator 500 (also referred to as "a quadrature delay locked loop 500" herein), according to some embodiments. In some embodiments, the quadrature clock signal generator 500 is implemented as the quadrature clock signal generator 300 of FIG. 3. In some embodiments, the quadrature clock signal generator 500 is substantially similar to the quadrature clock signal generator 400 of FIG. 4, except a delay circuitry 510 is added between the VCO 410 and the adjustable delay circuitry 420B. Thus, detailed description of the duplicated portion is omitted herein for the sake of brevity.

The delay circuitry 510 is a component or a circuitry that delays the high speed clock signals 415A, 415B to obtain the delayed clock signals 515A, 515B. In some embodiments, the delay circuitry 510 includes a first input port coupled to the first output port of the VCO 410 and a second input port coupled to the second output port of the VCO 410. In some embodiments, the delay circuitry 510 additionally includes a first output port coupled to the first input port of the adjustable delay circuitry 420B and a second output port coupled to the second input port of the adjustable delay circuitry 420B. In some embodiments, the delay circuitry 510 is implemented as inverters or amplifiers connected in cascade. In one aspect, the delay circuitry 510 delays the high speed clock signals 415A, 415B by a predetermined amount or a fixed amount (e.g., 25 ps), and outputs the delayed clock signal 515A at the first output port and the delayed clock signal 515B at the second output port.

In some embodiments, the adjustable delay circuitries 420A, 420B have identical structures. In one aspect, the adjustable delay circuitries 420A, 420B having identical structures (e.g., in close proximity and/or under similar environmental/operating conditions) can therefore have similar operating characteristics and tuning ranges despite PVT variations, compared to the adjustable delay circuitries 420A, 420B having different structures. For example, each of the adjustable delay circuitries has a tuning range between 10 ps to 50 ps, where the delay circuitry 510 delays the high speed clock signals 415A, 415B by 25 ps. Hence, in one aspect, the quadrature clock signal generator 500 is capable of tolerating wider ranges of PVT variations than the quadrature clock signal generator 400 of FIG. 4.

Figure 6:
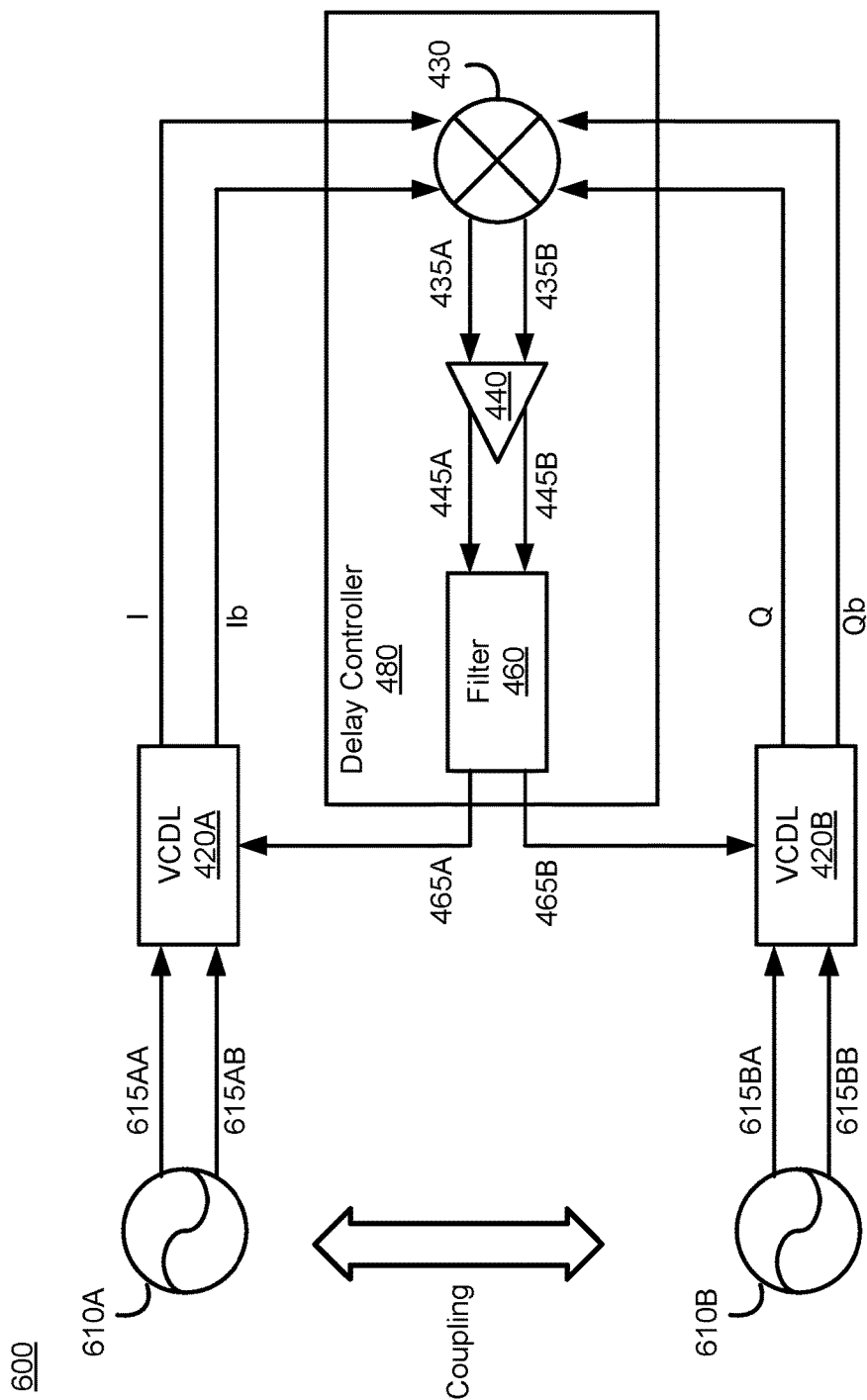
FIG. 6 is a diagram depicting another example quadrature clock signal generator.

Referring to FIG. 6, illustrated is a diagram depicting an example quadrature clock signal generator 600 (also referred to as "a quadrature delay locked loop 600" herein), according to some embodiments. In some embodiments, the quadrature clock signal generator 600 is implemented as the quadrature clock signal generator 300 of FIG. 3. In some embodiments, the quadrature clock signal generator 600 is substantially similar to the quadrature clock signal generator 400 of FIG. 4, except two VCOs 610A, 610B are implemented instead of a single VCO 410. Thus, detailed description of the duplicated portion is omitted herein for the sake of brevity.

In some embodiments, the VCOs 610A, 610B generate high speed clock signals 615AA, 615AB, 615BA, 615BB. In one aspect, the VCOs 610A, 610B are electrically coupled to each other through inductor, capacitor, resistor, a switch, a transistor or any combination of them, such that the high speed clock signals 615AA, 615AB, 615BA, 615BB have roughly 90-degree phase differences (e.g., 85-95 degree phase difference) with each other. For example, the high speed clock signals 615AA, 615BA have roughly a 90-degree phase difference with each other, and the high speed clock signals 615AB, 615BB have roughly a 90-degree phase difference with each other, where the high speed clock signals 615AA, 615AB have a 180-degree phase difference with each other, and the high speed clock signals 615BA, 615BB have a 180-degree phase difference with each other.

In some embodiments, the adjustable delay circuitry 420A delays the high speed clock signals 615AA, 615AB from the VCO 610A according to the first delay control signal 465A from the delay controller 480 to generate the quadrature clock signals I, Ib. In one configuration, the adjustable delay circuitry 420A includes a first input port coupled to the first output port of the VCO 610A, a second input port coupled to the second output port of the VCO 610A, and a control port coupled to a first output port of the delay controller 480. In some embodiments, the adjustable delay circuitry 420A additionally includes a first output port and a second output port. In this configuration, the adjustable delay circuitry 420A receives the high speed clock signal 615AA at the first input port, the high speed clock signal 615AB at the second input port, and a first delay control signal 465A at the control port. In some embodiments, the adjustable delay circuitry 420A delays the high speed clock signal 615AA according to the first delay control signal 465A to obtain the quadrature clock signal I, and delays the high speed clock signal 615AB according to the first delay control signal 465A to obtain the quadrature clock signal Ib. In some embodiments, the adjustable delay circuitry 420A outputs the quadrature clock signal I at the first output port, and outputs the quadrature clock signal Ib at the second output port.

In some embodiments, the adjustable delay circuitry 420B delays the high speed clock signals 615BA, 615BB from the VCO 610B according to a second delay control signal 465B from the delay controller 480 to generate quadrature clock signals Q, Qb. In one configuration, the adjustable delay circuitry 420B includes a first input port coupled to the first output port of the VCO 610B, a second input port coupled to the second output port of the VCO 610B, and a control port coupled to a second output port of the delay controller 480. In some embodiments, the adjustable delay circuitry 420B additionally includes a first output port and a second output port. In this configuration, the adjustable delay circuitry 420B receives the high speed clock signal 615BA at the first input port, the high speed clock signal 615BB at the second input port, and a second delay control signal 465B at the control port. In some embodiments, the adjustable delay circuitry 420B delays the high speed clock signal 615BA according to the second delay control signal 465B to obtain the quadrature clock signal Q, and delays the high speed clock signal 615BB according to the second delay control signal 465B to obtain the quadrature clock signal Qb. In some embodiments, the adjustable delay circuitry 420B outputs the quadrature clock signal Q at the first output port, and outputs the quadrature clock signal Qb at the second output port.

In some embodiments, the adjustable delay circuitries 420A, 420B have identical structures. In one aspect, the adjustable delay circuitries 420A, 420B with identical structures have similar tuning ranges despite of PVT variations, compared to the adjustable delay circuitries 420A, 420B with different structures. Hence, in one aspect, the quadrature clock signal generator 600 is capable of tolerating wider ranges of PVT variations than the quadrature clock signal generator 400 of FIG. 4. By employing two VCOs 610A, 610B coupled to each other to generate the high speed clock signals 615AA, 615AB, 615BA, 615BB, the delay circuitry 510 is omitted, in some embodiments.

Figure 7:
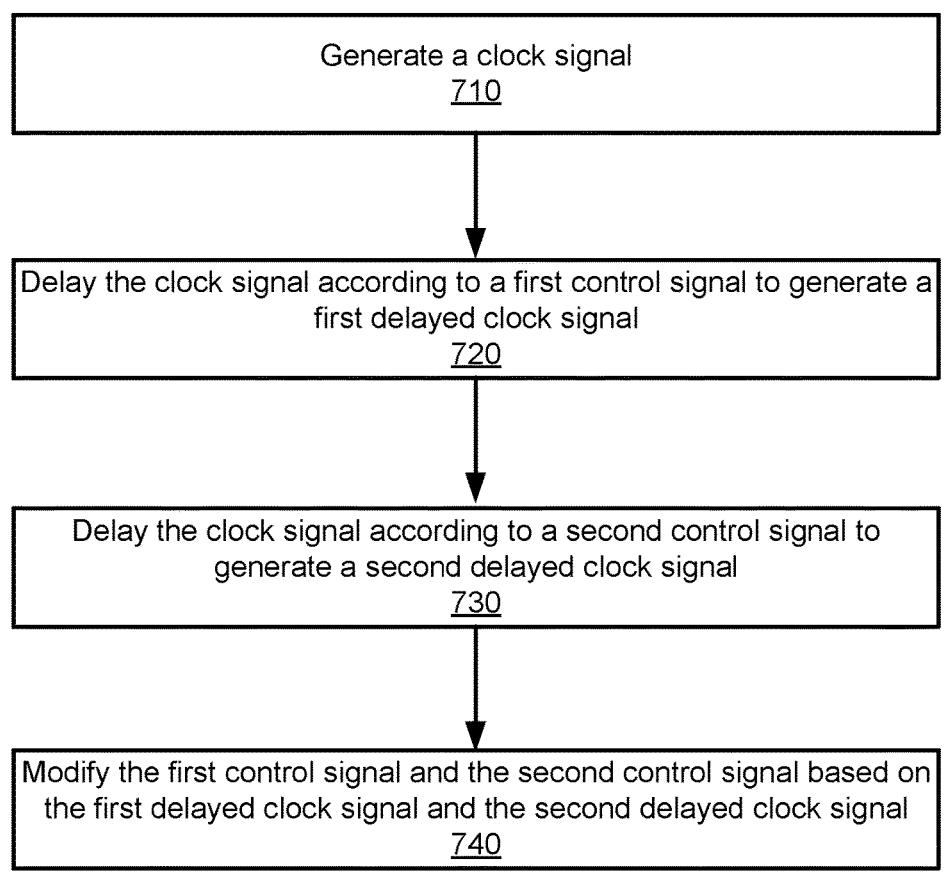
FIG. 7 is a flow chart depicting an example operation of a quadrature clock signal generator.

Referring to FIG. 7, illustrated is a flow chart depicting an example process 700 of generating high speed (e.g., 10 GHz or higher) quadrature clock signals, according to some embodiments. In some embodiments, the process 700 is performed by a quadrature clock signal generator (e.g., quadrature clock signal generator 400, 500 or 600). In other embodiments, the process 700 is performed by other entities. In some embodiments, the process 700 includes more, fewer, or different steps than shown in FIG. 7.

In some embodiments, the quadrature clock signal generator generates 710 a clock signal, for example, at a high frequency (e.g., over 10 GHz). In some embodiments, the quadrature clock signal generator generates two high speed clock signals having a 180-degree phase difference by a single VCO. In some embodiments, the quadrature clock signal generator generates four high speed clock signals by two VCOs coupled to each other through an inductor, a capacitor, a switch, a transistor or any combination of them. In one aspect, high speed clock signals from a first VCO have roughly 90-degree phase differences relative to high speed clock signals from a second VCO.

In some embodiments, the quadrature clock signal generator generates 720 the clock signal according to a first control signal to generate a first delayed clock signal, and delays 730 the clock signal according to a second control signal to generate a second delayed clock signal. In one aspect, the clock signals are delayed such that the first delayed clock signal and the second delayed clock signal have a 90-degree phase difference with each other.

In one approach, the quadrature clock signal generator delays high speed clock signals having a 180-degree phase difference with each other by a first adjustable delay circuitry (e.g., delay circuitry 420A of FIG. 4) and delays the same high speed clock signals having the 180-degree phase difference by a second adjustable delay circuitry (e.g., delay circuitry 420B of FIG. 4). In this approach, the adjustable delay circuitries have different architectures, and/or have different tuning ranges. In another approach, the quadrature clock signal generator delays high speed clock signals having a 180-degree phase difference with each other by a first adjustable delay circuitry (e.g., delay circuitry 420A of FIG. 5) and delays the same high speed clock signals having the 180-degree phase difference by a fixed delay circuitry and a second adjustable delay circuitry (e.g., delay circuitry 420B of FIG. 5). In this approach, the adjustable delay circuitries have same architectures, and have the same or similar tuning ranges. In another approach, the quadrature clock signal generator delays high speed clock signals having a 180-degree phase difference with each other from a first VCO by a first adjustable delay circuitry (e.g., delay circuitry 420A of FIG. 6) and delays different high speed clock signals having a 180-degree phase difference with each other from a second VCO by a second adjustable delay circuitry (e.g., delay circuitry 420B of FIG. 6). In this approach, the adjustable delay circuitries 420A, 420B of FIG. 6 have same architectures, and have the same or similar tuning ranges without implementing a fixed delay circuitry.

In some embodiments, the quadrature clock signal generator modifies 740 the first control signal and the second control signal based on the first delayed clock signal and the second delayed clock signal. In one approach, the quadrature clock signal generator downconverts the first delayed clock signal and the second delayed clock signal, for example, at a DC frequency or at an intermediate frequency (IF), and filters out spectral components over a predetermined frequency in the downconverted converted signals to generate the first control signal and the second controls signal. Through feedback operations, in case the first delayed clock signal and the second delayed clock signal do not have a 90-degree phase difference, the quadrature clock signal generator modifies the first control signal and the second control signal according to an error of phases of the first delayed clock signal and the second delayed clock signal such that relative phases of the first delayed clock signal and the second delayed clock signal with respect to each other are adjusted to have a 90-degree difference.

Various embodiments disclosed herein are related to an apparatus for generating a quadrature clock signal. In some embodiments, the apparatus includes an oscillator circuitry configured to generate a clock signal. In some embodiments, the apparatus includes a first delay circuitry coupled to the oscillator circuitry, where the first delay circuitry is configured to delay the clock signal from the oscillator circuitry according to a first control signal to generate a first delayed clock signal. In some embodiments, the apparatus includes a second delay circuitry coupled to the oscillator circuitry, where the second delay circuitry is configured to delay the clock signal from the oscillator circuitry according to a second control signal to generate a second delayed clock signal. In some embodiments, the first delayed clock signal and the second delayed clock signal have a substantially 90-degree phase difference with each other. In some embodiments, the apparatus includes a delay controller circuitry coupled to the first delay circuitry and the second delay circuitry. In some embodiments, the delay controller circuitry and the first delay circuitry form a first feedback loop, and the delay controller circuitry and the second delay circuitry form a second feedback loop. In some embodiments, the delay controller circuitry is configured to modify i) the first control signal based on the first delayed clock signal through the first feedback loop and ii) the second control signal based on the second delayed clock signal through the second feedback loop. In some embodiments, the delay controller circuitry is configured to determine a difference between the first delayed clock signal and the second delayed clock signal, and to modify the first control signal and the second control signal according to the determined difference.

In some embodiments, the oscillator circuitry is further configured to generate an inverted clock signal having a substantially 180-degree phase difference with the clock signal. In some embodiments, the first delay circuitry is configured to delay the inverted clock signal according to the first control signal to generate a third delayed clock signal, where the first delayed clock signal and the third delayed clock signal have a substantially 180-degree phase difference with each other. In some embodiments, the second delay circuitry is configured to delay the inverted clock signal according to the second control signal to generate a fourth delayed clock signal, where the second delayed clock signal and the fourth delayed clock signal have a substantially 180-degree phase difference with each other.

In some embodiments, the first delay circuitry and the second delay circuitry are configured to delay the clock signal by different delay amounts.

In some embodiments, the apparatus further includes a fixed delay circuitry coupled between the oscillator circuitry and the second delay circuitry, where the fixed delay circuitry is configured to delay the clock signal by a predetermined amount.

In some embodiments, the first delay circuitry and the second delay circuitry have identical circuit components.

In some embodiments, the first delay circuitry is configured to delay the clock signal by a delay amount according to the first control signal, and the second delay circuitry is configured to delay the clock signal by the delay amount according to the second control signal.

In some embodiments, the first control signal and the second control signal are differential signals.

In some embodiments, the delay controller circuitry includes a downconverter circuitry coupled to the first delay circuitry and the second delay circuitry, where the downconverter circuitry is configured to downconvert the first delayed clock signal and the second delayed clock signal to obtain a first downconverted signal and a second downconverted signal. In some embodiments, the delay controller circuitry includes a filter circuitry coupled to the downconverter circuitry, where the filter circuitry is configured to filter spectral components above a predetermined frequency in the first downconverted signal to generate the first control signal, and filter spectral components above the predetermined frequency in the second downconverted signal to generate the second control signal. In some embodiments, the delay controller circuitry includes an amplifier coupled between i) the downconverter circuitry and ii) the filter circuitry, or between i) the filter circuitry and ii) the first delay circuitry and the second delay circuitry.

Various embodiments disclosed herein are related to a method of generating a quadrature clock signal. In some embodiments, the method includes generating, by an oscillator circuitry, a clock signal. In some embodiments, the method includes delaying, by a first delay circuitry coupled to the oscillator circuitry, the clock signal from the oscillator circuitry according to a first control signal to generate a first delayed clock signal. In some embodiments, the method includes delaying, by a second delay circuitry coupled to the oscillator circuitry, the clock signal according to a second control signal to generate a second delayed clock signal. In some embodiments, the first delayed clock signal and the second delayed clock signal have a substantially 90-degree phase difference with each other. In some embodiments, the method includes modifying, by a delay controller circuitry forming a first feedback loop with the first delay circuitry and forming a second feedback loop with the second delay circuitry, i) the first control signal based on the first delayed clock signal through the first feedback loop and ii) the second control signal based on the second delayed clock signal through the second feedback loop. In some embodiments, the method includes determining, by the delay controller circuitry, a difference between the first delayed clock signal and the second delayed clock signal, and modifying, by the delay controller circuitry, the first control signal and the second control signal according to the determined difference.

In some embodiments, the method includes generating, by the oscillator circuitry, an inverted clock signal having a substantially 180-degree phase difference with the clock signal. In some embodiments, the method further includes delaying, by the first delay circuitry, the inverted clock signal according to the first control signal to generate a third delayed clock signal, where the first delayed clock signal and the third delayed clock signal have a substantially 180-degree phase difference with each other. In some embodiments, the method further includes delaying, by the second delay circuitry, the inverted clock signal according to the second control signal to generate a fourth delayed clock signal, where the second delayed clock signal and the fourth delayed clock signal have a substantially 180-degree phase difference with each other.

In some embodiments, the first delay circuitry and the second delay circuitry delay the clock signal by different delay amounts.

In some embodiments, the method further includes delaying, by a fixed delay circuitry coupled between the oscillator circuitry and the second delay circuitry, the clock signal by a predetermined amount.

In some embodiments, the method further includes delaying, by the second delay circuitry, a signal output from the fixed delay circuitry by an amount corresponding to the second control signal.

In some embodiments, the first delay circuitry is configured to delay the clock signal by a delay amount corresponding to the first control signal, and the second delay circuitry is configured to delay the clock signal by the delay amount corresponding to the second control signal.

In some embodiments, the first control signal and the second control signal are differential signals.

Various embodiments disclosed herein are related to an apparatus for generating a quadrature clock signal. In some embodiments, the apparatus includes a first oscillator circuitry configured to generate a first clock signal. In some embodiments, the apparatus further includes a second oscillator circuitry coupled to the first oscillator circuitry, where the second oscillator circuitry is configured to generate a second clock signal. In some embodiments, the apparatus further includes a first delay circuitry coupled to the first oscillator circuitry, where the first delay circuitry is configured to delay the first clock signal from the first oscillator circuitry according to a first control signal to generate a first delayed clock signal. In some embodiments, the apparatus further includes a second delay circuitry coupled to the second oscillator circuitry, where the second delay circuitry is configured to delay the second clock signal from the second oscillator circuitry according to a second control signal to generate a second delayed clock signal. In some embodiments, the first delayed clock signal and the second delayed clock signal have a substantially 90-degree phase difference with each other. In some embodiments, the apparatus further includes a delay controller circuitry coupled to the first delay circuitry and the second delay circuitry. In some embodiments, the delay controller circuitry forms a first feedback loop with the first delay circuitry and forms a second feedback loop with the second delay circuitry. In some embodiments, the delay controller circuitry is configured to modify i) the first control signal based on the first delayed clock signal through the first feedback loop and ii) the second control signal based on the second delayed clock signal through the second feedback loop. In some embodiments, the delay controller circuitry is configured to determine a difference between the first delayed clock signal and the second delayed clock signal, and modify the first control signal and the second control signal according to the determined difference.

In some embodiments, the first oscillator circuitry is configured to generate a first inverted clock signal having a substantially 180-degree phase difference with the first clock signal. In some embodiments, the first delay circuitry is configured to delay the first inverted clock signal according to the first control signal to generate a third delayed clock signal, where the first delayed clock signal and the third delayed clock signal have a substantially 180-degree phase difference with each other. In some embodiments, the second oscillator circuitry is configured to generate a second inverted clock signal having a substantially 180-degree phase difference with the second clock signal. In some embodiments, the second delay circuitry is configured to delay the second inverted clock signal according to the second control signal to generate a fourth delayed clock signal, where the second delayed clock signal and the fourth delayed clock signal have a substantially 180-degree phase difference with each other.

In some embodiments, the first delay circuitry and the second delay circuitry have identical circuit components.

In some embodiments, the first delay circuitry is configured to delay the first clock signal by a delay amount according to the first control signal, and the second delay circuitry is configured to delay the second clock signal by the delay amount according to the second control signal.

In some embodiments, the delay controller circuitry includes a downconverter circuitry coupled to the first delay circuitry and the second delay circuitry. In some embodiments, the downconverter circuitry is configured to downconvert the first delayed clock signal and the second delayed clock signal to obtain a first downconverted signal and a second downconverted signal. In some embodiments, the delay controller circuitry includes a filter circuitry coupled to the downconverter circuitry, where the filter circuitry is configured to filter spectral components above a predetermined frequency in the first downconverted signal to generate the first control signal, and filter spectral components above the predetermined frequency in the second downconverted signal to generate the second control signal. In some embodiments, the delay controller circuitry includes an amplifier coupled between i) the downconverter circuitry and ii) the filter circuitry, or between i) the filter circuitry and ii) the first delay circuitry and the second delay circuitry.

B. Computing and Network Environment

Figure 8A:
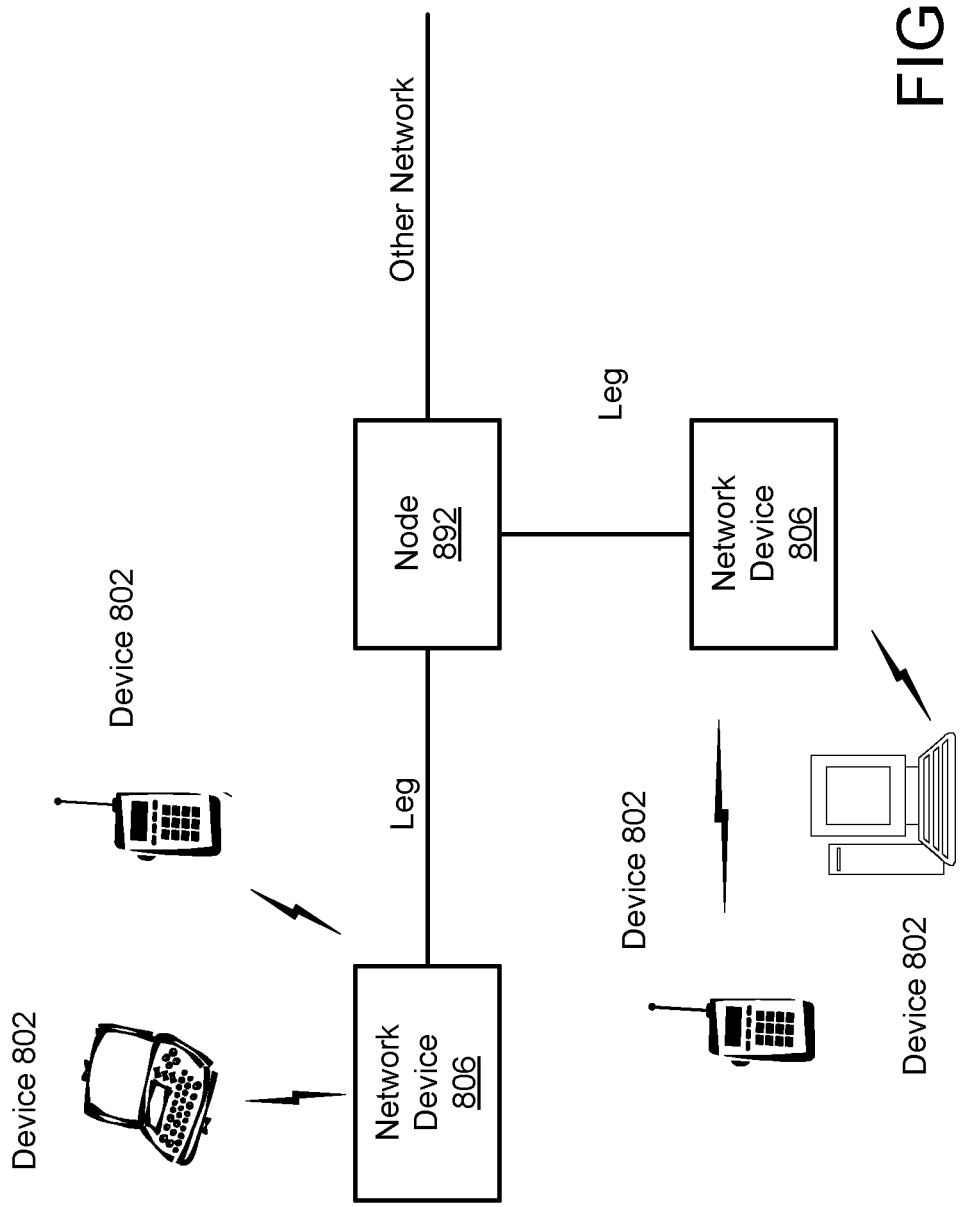
FIG. 8A is a block diagram depicting an embodiment of a network environment including one or more network devices in communication with one or more devices or stations.

Having discussed specific embodiments of the present solution, it may be helpful to describe aspects of the operating environment as well as associated system components (e.g., hardware elements) in connection with the methods and systems described herein. Referring to FIG. 8A, an embodiment of a network environment is depicted. In brief overview, the network environment includes a communication system that includes one or more network devices 806, one or more communication devices 802 and a node 892. The communication devices 802 may for example include laptop computers 802, tablets 802, personal computers 802 and/or cellular telephone devices 802. In some embodiments, the device 802, the network device 806, the node 892, or any combination is implemented as a network device employing the phase locked loop 100 of FIG. 1. The details of an embodiment of each communication device and/or network device are described in greater detail with reference to FIGS. 8B and 8C. The network environment can be an ad hoc network environment, an infrastructure network environment, a subnet environment, etc.

The network devices 806 may be operably coupled to the node 892 via local area network connections. The node 892, which may include a router, gateway, switch, bridge, modem, system controller, appliance, etc., may provide a local area network connection for the communication system. Each of the network devices 806 may have an associated antenna or an antenna array to communicate with the communication devices 802 in its area. The communication devices 802 may register with a particular network device 806 to receive services from the communication system (e.g., via a SU-MIMO or MU-MIMO configuration). For direct connections (e.g., point-to-point communications), some communication devices 802 may communicate directly via an allocated channel and communications protocol. Some of the communication devices 802 may be mobile or relatively static with respect to the network device 806.

In some embodiments a network device 806 includes a device or module (including a combination of hardware and software) that allows communication devices 802 to connect to a wired network using Wi-Fi, or other standards. A network device 806 may be configured, designed, and/or built for operating in a wireless local area network (WLAN). A network device 806 may connect to a router (e.g., via a wired network) as a standalone device in some embodiments. In other embodiments, a network device can be a component of a router. A network device 806 can provide multiple devices 802 access to a network. A network device 806 may, for example, connect to the devices 802 through a wired Ethernet connection, a wireless Wi-Fi connection, or both. A network device 806 may be built and/or configured to support a standard for sending and receiving data using one or more radio frequencies. Those standards, and the frequencies they use may be defined by the IEEE (e.g., IEEE 802.11 standards). A network device may be configured and/or used to support public Internet hotspots, and/or on an internal network to extend the network's Wi-Fi signal range.

In some embodiments, the network devices 806 may be used for (e.g., in-home or in-building) wireless networks (e.g., IEEE 802.11, Bluetooth, ZigBee, any other type of radio frequency based network protocol and/or variations thereof). Each of the communication devices 802 may include a built-in radio and/or is coupled to a radio. Such communication devices 802 and/or network devices 806 may operate in accordance with the various aspects of the disclosure as presented herein to enhance performance, reduce costs and/or size, and/or enhance broadband applications. Each communication devices 802 may have the capacity to function as a client node seeking access to resources (e.g., data, and connection to networked nodes such as servers) via one or more network devices 806.

The network connections may include any type and/or form of network and may include any of the following: a point-to-point network, a broadcast network, a telecommunications network, a data communication network, and a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 8B:
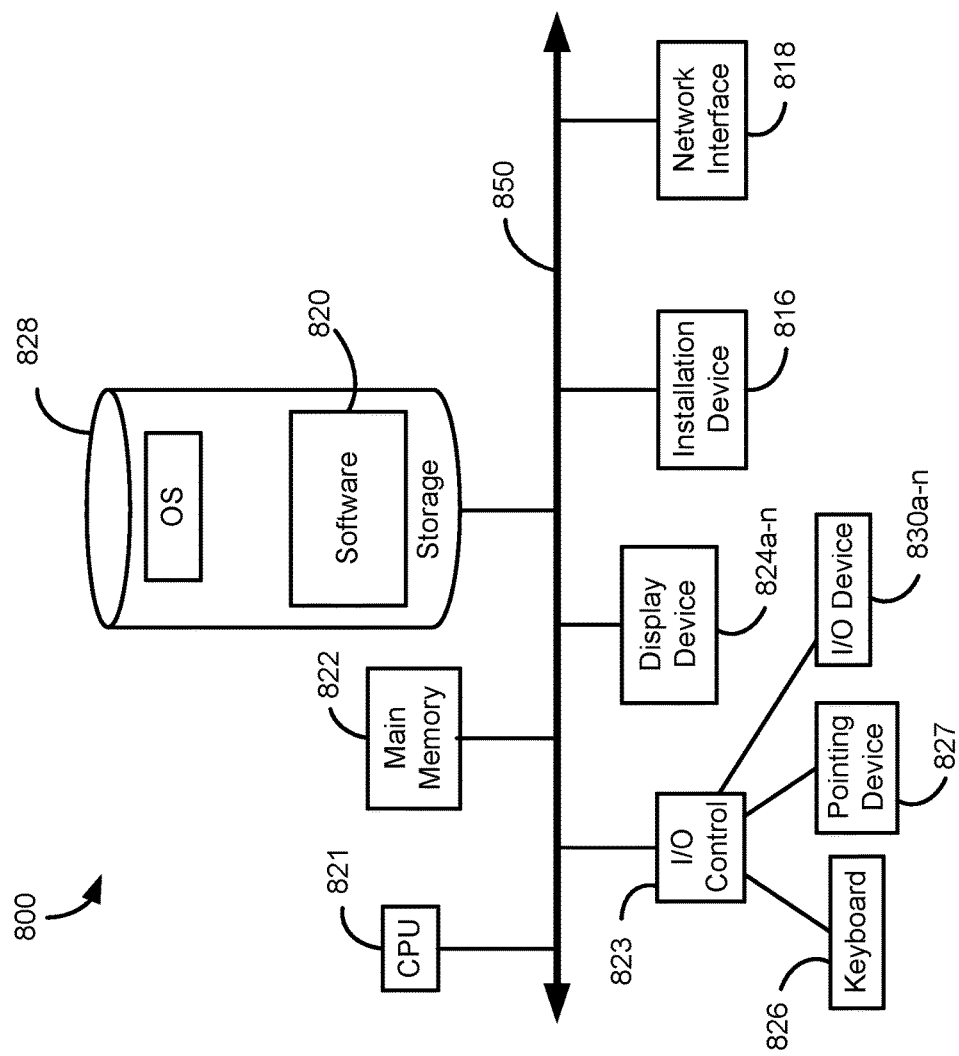
FIGS. 8B and 8C are block diagrams depicting embodiments of computing devices useful in connection with the methods and systems described herein.
Figure 8C:
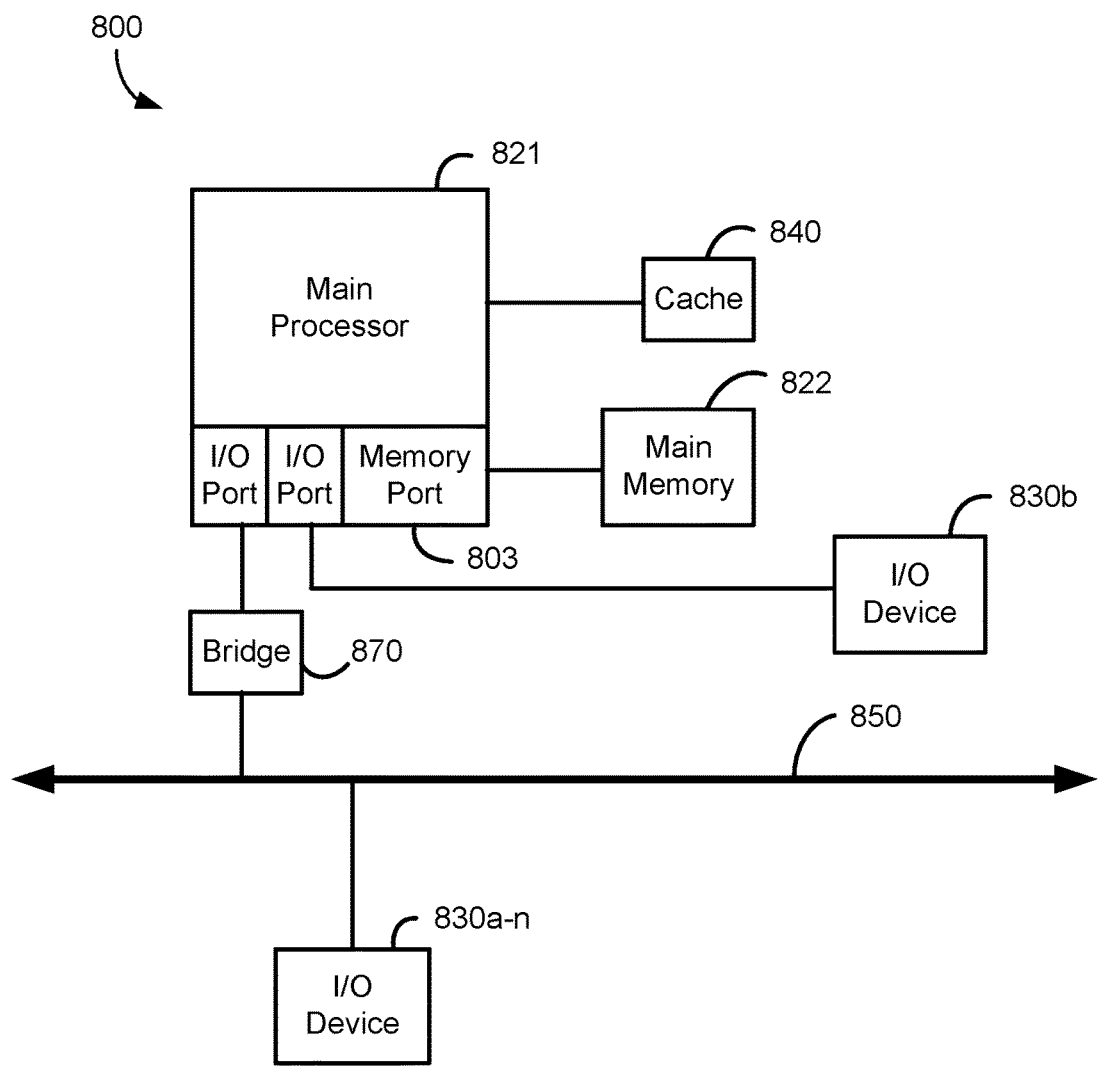

The node 892, the communications device(s) 802 and network device(s) 806 may be deployed as and/or executed on any type and form of computing device, such as a computer, network device or appliance capable of communicating on any type and form of network and performing the operations described herein. FIGS. 8B and 8C depict block diagrams of a computing device 800 useful for practicing an embodiment of the node 892, the communication devices 802 or the network device 806. As shown in FIGS. 8B and 8C, each computing device 800 includes a central processing unit 821, and a main memory unit 822. As shown in FIG. 8B, a computing device 800 may include a storage device 828, an installation device 816, a network interface 818, an I/O controller 823, display devices 824a-824n, a keyboard 826 and a pointing device 827, such as a mouse. The storage device 828 may include, without limitation, an operating system and/or software. As shown in FIG. 8C, each computing device 800 may also include additional optional elements, such as a memory port 803, a bridge 870, one or more input/output devices 830a-830n (generally referred to using reference numeral 830), and a cache memory 840 in communication with the central processing unit 821.

The central processing unit 821 is any logic circuitry that responds to and processes instructions fetched from the main memory unit 822. In many embodiments, the central processing unit 821 is provided by a microprocessor unit, such as: those manufactured by Intel Corporation of Santa Clara, Calif.; those manufactured by International Business Machines of White Plains, N.Y.; or those manufactured by Advanced Micro Devices of Sunnyvale, Calif. The computing device 800 may be based on any of these processors, or any other processor capable of operating as described herein.

Main memory unit 822 may be one or more memory chips capable of storing data and allowing any storage location to be directly accessed by the microprocessor 821, such as any type or variant of Static random access memory (SRAM), Dynamic random access memory (DRAM), Ferroelectric RAM (FRAM), NAND Flash, NOR Flash and Solid State Drives (SSD). The main memory 822 may be based on any of the above described memory chips, or any other available memory chips capable of operating as described herein. In the embodiment shown in FIG. 8B, the processor 821 communicates with main memory 822 via a system bus 850 (described in more detail below). FIG. 8C depicts an embodiment of a computing device 800 in which the processor communicates directly with main memory 822 via a memory port 803. For example, in FIG. 8C the main memory 822 may be DRDRAM.

FIG. 8C depicts an embodiment in which the main processor 821 communicates directly with cache memory 840 via a secondary bus, sometimes referred to as a backside bus. In other embodiments, the main processor 821 communicates with cache memory 840 using the system bus 850. Cache memory 840 typically has a faster response time than main memory 822 and is provided by, for example, SRAM, BSRAM, or EDRAM. In the embodiment shown in FIG. 8C, the processor 821 communicates with various I/O devices 830 via a local system bus 850. Various buses may be used to connect the central processing unit 821 to any of the I/O devices 830, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 824, the processor 821 may use an Advanced Graphics Port (AGP) to communicate with the display 824. FIG. 8C depicts an embodiment of a computer 800 in which the main processor 821 may communicate directly with I/O device 830b, for example via HYPERTRANSPORT, RAPIDIO, or INFINIBAND communications technology. FIG. 8C also depicts an embodiment in which local busses and direct communication are mixed: the processor 821 communicates with I/O device 830a using a local interconnect bus while communicating with I/O device 830b directly.

A wide variety of I/O devices 830a-830n may be present in the computing device 800. Input devices include keyboards, mice, trackpads, trackballs, microphones, dials, touch pads, touch screen, and drawing tablets. Output devices include video displays, speakers, inkjet printers, laser printers, projectors, and dye-sublimation printers. The I/O devices may be controlled by an I/O controller 823 as shown in FIG. 8B. The I/O controller may control one or more I/O devices such as a keyboard 826 and a pointing device 827, e.g., a mouse or optical pen. Furthermore, an I/O device may also provide storage and/or an installation medium 816 for the computing device 800. In still other embodiments, the computing device 800 may provide USB connections (not shown) to receive handheld USB storage devices such as the USB Flash Drive line of devices manufactured by Twintech Industry, Inc. of Los Alamitos, Calif.

Referring again to FIG. 8B, the computing device 800 may support any suitable installation device 816, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 800 may further include a storage device, such as one or more hard disk drives or redundant arrays of independent disks, for storing an operating system and other related software, and for storing application software programs such as any program or software 820 for implementing (e.g., configured and/or designed for) the systems and methods described herein. Optionally, any of the installation devices 816 could also be used as the storage device. Additionally, the operating system and the software can be run from a bootable medium.

Furthermore, the computing device 800 may include a network interface 818 to interface to the network 804 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 800 communicates with other computing devices 800' via any type and/or form of gateway or tunneling protocol such as Secure Socket Layer (SSL) or Transport Layer Security (TLS). The network interface 818 may include a built-in network adapter, network interface card, PCMCIA network card, card bus network adapter, wireless network adapter, USB network adapter, modem or any other device suitable for interfacing the computing device 800 to any type of network capable of communication and performing the operations described herein.

In some embodiments, the computing device 800 may include or be connected to one or more display devices 824a-824n. As such, any of the I/O devices 830a-830n and/or the I/O controller 823 may include any type and/or form of suitable hardware, software, or combination of hardware and software to support, enable or provide for the connection and use of the display device(s) 824a-824n by the computing device 800. For example, the computing device 800 may include any type and/or form of video adapter, video card, driver, and/or library to interface, communicate, connect or otherwise use the display device(s) 824a-824n. In one embodiment, a video adapter may include multiple connectors to interface to the display device(s) 824a-824n. In other embodiments, the computing device 800 may include multiple video adapters, with each video adapter connected to the display device(s) 824a-824n. In some embodiments, any portion of the operating system of the computing device 800 may be configured for using multiple displays 824a-824n. One ordinarily skilled in the art will recognize and appreciate the various ways and embodiments that a computing device 800 may be configured to have one or more display devices 824a-824n.

In further embodiments, an I/O device 830 may be a bridge between the system bus 850 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 800 of the sort depicted in FIGS. 8B and 8C may operate under the control of an operating system, which control scheduling of tasks and access to system resources. The computing device 800 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 800 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 800 has sufficient processor power and memory capacity to perform the operations described herein.

In some embodiments, the computing device 800 may have different processors, operating systems, and input devices consistent with the device. For example, in one embodiment, the computing device 800 is a smart phone, mobile device, tablet or personal digital assistant. In still other embodiments, the computing device 800 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 800 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices, for example, consistent with the terms "user" and "multi-user" typically used in the context of a multi-user multiple-input and multiple-output (MU-MIMO) environment.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. An apparatus comprising:
   an oscillator circuitry configured to generate a clock signal;
   a first delay circuitry coupled to the oscillator circuitry, the first delay circuitry configured to delay the clock signal from the oscillator circuitry according to a first control signal to generate a first delayed clock signal;
   a second delay circuitry coupled to the oscillator circuitry, the second delay circuitry configured to delay the clock signal from the oscillator circuitry according to a second control signal to generate a second delayed clock signal, the first delayed clock signal and the second delayed clock signal having a substantially 90-degree phase difference with each other; and
   a delay controller circuitry coupled to the first delay circuitry and the second delay circuitry, the delay controller circuitry and the first delay circuitry forming a first feedback loop, the delay controller circuitry and the second delay circuitry forming a second feedback loop, the delay controller circuitry configured to determine a difference between the first delayed clock signal and the second delayed clock signal and modify the first control signal and the second control signal according to the determined difference.

2. The apparatus of claim 1,
wherein the oscillator circuitry is further configured to generate an inverted clock signal having a substantially 180-degree phase difference with the clock signal,
wherein the first delay circuitry is configured to delay the inverted clock signal according to the first control signal to generate a third delayed clock signal, the first delayed clock signal and the third delayed clock signal having a substantially 180-degree phase difference with each other, and
wherein the second delay circuitry is configured to delay the inverted clock signal according to the second control signal to generate a fourth delayed clock signal, the second delayed clock signal and the fourth delayed clock signal having a substantially 180-degree phase difference with each other.

3. The apparatus of claim 1, wherein the first delay circuitry and the second delay circuitry are configured to delay the clock signal by different delay amounts.

4. The apparatus of claim 1, further comprising:
a fixed delay circuitry coupled between the oscillator circuitry and the second delay circuitry, the fixed delay circuitry configured to delay the clock signal by a predetermined amount.

5. The apparatus of claim 4, wherein the first delay circuitry and the second delay circuitry have identical circuit components.

6. The apparatus of claim 4, wherein the first delay circuitry is configured to delay the clock signal by a delay amount according to the first control signal, and the second delay circuitry is configured to delay the clock signal by the delay amount according to the second control signal.

7. The apparatus of claim 1, wherein the first control signal and the second control signal are differential signals.

8. The apparatus of claim 1, wherein the delay controller circuitry includes:
a downconverter circuitry coupled to the first delay circuitry and the second delay circuitry, the downconverter circuitry configured to downconvert the first delayed clock signal and the second delayed clock signal to obtain a first downconverted signal and a second downconverted signal, and
a filter circuitry coupled to the downconverter circuitry, the filter circuitry configured to:
filter spectral components above a predetermined frequency in the first downconverted signal to generate the first control signal, and
filter spectral components above the predetermined frequency in the second downconverted signal to generate the second control signal.

9. A method comprising:
generating, by an oscillator circuitry, a clock signal;
delaying, by a first delay circuitry coupled to the oscillator circuitry, the clock signal from the oscillator circuitry according to a first control signal to generate a first delayed clock signal;
delaying, by a second delay circuitry coupled to the oscillator circuitry, the clock signal according to a second control signal to generate a second delayed clock signal, the first delayed clock signal and the second delayed clock signal having a substantially 90-degree phase difference with each other;
determining, by a delay controller circuitry coupled to the first delay circuitry and the second delay circuitry, a difference between the first delayed clock signal and the second delayed clock signal; and
modifying, by the delay controller circuitry, the first control signal and the second control signal according to the determined difference.

10. The method of claim 9, further comprising:
generating, by the oscillator circuitry, an inverted clock signal having a substantially 180-degree phase difference with the clock signal;
delaying, by the first delay circuitry, the inverted clock signal according to the first control signal to generate a third delayed clock signal, the first delayed clock signal and the third delayed clock signal having a substantially 180-degree phase difference with each other; and
delaying, by the second delay circuitry, the inverted clock signal according to the second control signal to generate a fourth delayed clock signal, the second delayed clock signal and the fourth delayed clock signal having a substantially 180-degree phase difference with each other.

11. The method of claim 9, wherein the first delay circuitry and the second delay circuitry delay the clock signal by different delay amounts.

12. The method of claim 9, further comprising:
delaying, by a fixed delay circuitry coupled between the oscillator circuitry and the second delay circuitry, the clock signal by a predetermined amount.

13. The method of claim 12, further comprising:
delaying, by the second delay circuitry, a signal output from the fixed delay circuitry by an amount corresponding to the second control signal.

14. The method of claim 12, wherein the first delay circuitry is configured to delay the clock signal by a delay amount corresponding to the first control signal, and the second delay circuitry is configured to delay the clock signal by the delay amount corresponding to the second control signal.

15. The method of claim 9, wherein the first control signal and the second control signal are differential signals.

16. An apparatus comprising:
a first oscillator circuitry configured to generate a first clock signal;
a second oscillator circuitry coupled to the first oscillator circuitry, the second oscillator circuitry configured to generate a second clock signal;
a first delay circuitry coupled to the first oscillator circuitry, the first delay circuitry configured to delay the first clock signal from the first oscillator circuitry according to a first control signal to generate a first delayed clock signal;
a second delay circuitry coupled to the second oscillator circuitry, the second delay circuitry configured to delay the second clock signal from the second oscillator circuitry according to a second control signal to generate a second delayed clock signal, the first delayed clock signal and the second delayed clock signal having a substantially 90-degree phase difference with each other; and
a delay controller circuitry coupled to the first delay circuitry and the second delay circuitry, the delay controller circuitry configured to determine a difference between the first delayed clock signal and the second delayed clock signal and modify the first control signal and the second control signal according to the determined difference.

17. The apparatus of claim 16,
wherein the first oscillator circuitry is configured to generate a first inverted clock signal having a substantially 180-degree phase difference with the first clock signal,
wherein the first delay circuitry is configured to delay the first inverted clock signal according to the first control signal to generate a third delayed clock signal, the first delayed clock signal and the third delayed clock signal having a substantially 180-degree phase difference with each other,
wherein the second oscillator circuitry is configured to generate a second inverted clock signal having a substantially 180-degree phase difference with the second clock signal, and
wherein the second delay circuitry is configured to delay the second inverted clock signal according to the second control signal to generate a fourth delayed clock signal, the second delayed clock signal and the fourth delayed clock signal having a substantially 180-degree phase difference with each other.

18. The apparatus of claim 17, wherein the first delay circuitry and the second delay circuitry have identical circuit components.

19. The apparatus of claim 17, wherein the first delay circuitry is configured to delay the first clock signal by a delay amount according to the first control signal, and the second delay circuitry is configured to delay the second clock signal by the delay amount according to the second control signal.

20. The apparatus of claim 16, wherein the delay controller circuitry includes:
a downconverter circuitry coupled to the first delay circuitry and the second delay circuitry, the downconverter circuitry configured to downconvert the first delayed clock signal and the second delayed clock signal to obtain a first downconverted signal and a second downconverted signal, and
a filter circuitry coupled to the downconverter circuitry, the filter circuitry configured to:
filter spectral components above a predetermined frequency in the first downconverted signal to generate the first control signal, and
filter spectral components above the predetermined frequency in the second downconverted signal to generate the second control signal.

\* \* \* \* \*